(12) United States Patent
Kuno et al.

(10) Patent No.: US 12,444,587 B2
(45) Date of Patent: Oct. 14, 2025

(54) WAFER PLACEMENT TABLE WITH HEAT DISSIPATION SHEET

(71) Applicant: NGK Insulators, Ltd., Nagoya (JP)

(72) Inventors: Tatsuya Kuno, Nagoya (JP); Taro Usami, Kakamigahara (JP); Masaki Ishikawa, Handa (JP)

(73) Assignee: NGK INSULATORS, LTD., Nagoya (JP)

( * ) Notice: Subject to any disclaimer, the term of this patent is extended or adjusted under 35 U.S.C. 154(b) by 193 days.

(21) Appl. No.: 18/166,652

(22) Filed: Feb. 9, 2023

(65) Prior Publication Data

US 2024/0079217 A1 Mar. 7, 2024

Related U.S. Application Data

(63) Continuation of application No. PCT/JP2022/033051, filed on Sep. 2, 2022.

(51) Int. Cl.
*H01J 37/32* (2006.01)
*H01L 21/683* (2006.01)

(52) U.S. Cl.
CPC .... *H01J 37/32724* (2013.01); *H01L 21/6833* (2013.01); *H01J 2237/002* (2013.01); *H01J 2237/2007* (2013.01)

(58) Field of Classification Search
CPC ........... H01J 37/32724; H01J 2237/002; H01J 2237/2007; H01L 21/6833;

(Continued)

(56) References Cited

U.S. PATENT DOCUMENTS

2008/0116187 A1   5/2008 Sugimoto et al.
2010/0244350 A1*  9/2010 Fujisato .................. C23C 14/50
                                               269/289 R (Continued)

FOREIGN PATENT DOCUMENTS

JP   2008-130609 A   6/2008
JP   2021-150329 A   9/2021

(Continued)

OTHER PUBLICATIONS

International Search Report and Written Opinion (Application No. PCT/JP2022/033051) dated Oct. 25, 2022.

(Continued)

*Primary Examiner* — Sreeya Sreevatsa
(74) *Attorney, Agent, or Firm* — BURR PATENT LAW, PLLC

(57) ABSTRACT

A wafer placement table includes an upper substrate; a lower substrate; a through hole extending through the lower substrate in an up-down direction; a plurality of projections provided in a dot pattern, for example, at an entirety of an upper surface of the lower substrate and being in contact with the lower surface of the upper substrate; a heat dissipation sheet having a projection insertion hole and being disposed between the upper substrate and the lower substrate; a screw hole provided, in the lower surface of the upper substrate, at a position facing the through hole; a screw member inserted from a lower surface of the lower substrate into the through hole and screwed into the screw hole.

8 Claims, 11 Drawing Sheets

(58) Field of Classification Search
CPC ......... H01L 21/67103; H01L 21/67109; H01L 21/6831; H01L 21/68757; H01L 21/68785
USPC ........................................................ 361/234
See application file for complete search history.

(56) References Cited

U.S. PATENT DOCUMENTS

| | | | |
|---|---|---|---|
| 2017/0256431 A1* | 9/2017 | Parkhe .............. | H01L 21/67248 |
| 2017/0345691 A1* | 11/2017 | Parkhe .............. | H01L 21/67109 |
| 2019/0189491 A1* | 6/2019 | Akatsuka .......... | H01L 21/67103 |
| 2021/0287925 A1* | 9/2021 | Shimomura ...... | H01J 37/32715 |
| 2022/0246451 A1 | 8/2022 | Takebayashi et al. | |

FOREIGN PATENT DOCUMENTS

| | | | |
|---|---|---|---|
| JP | 2022-119239 A | | 8/2022 |
| KR | 10-2018-0008781 A | | 1/2018 |
| KR | 10-2019-0032545 A | | 3/2019 |
| WO | 2016/186702 A | | 11/2016 |
| WO | 2018/038044 A1 | | 3/2018 |

OTHER PUBLICATIONS

Korean Office Action (with English translation) dated Jul. 4, 2024 (Application No. 10-2023-7005105).

English translation of the International Preliminary Report on Patentability (Chapter I) dated Mar. 13, 2025 (Application No. PCT/JP2022/033051).

* cited by examiner

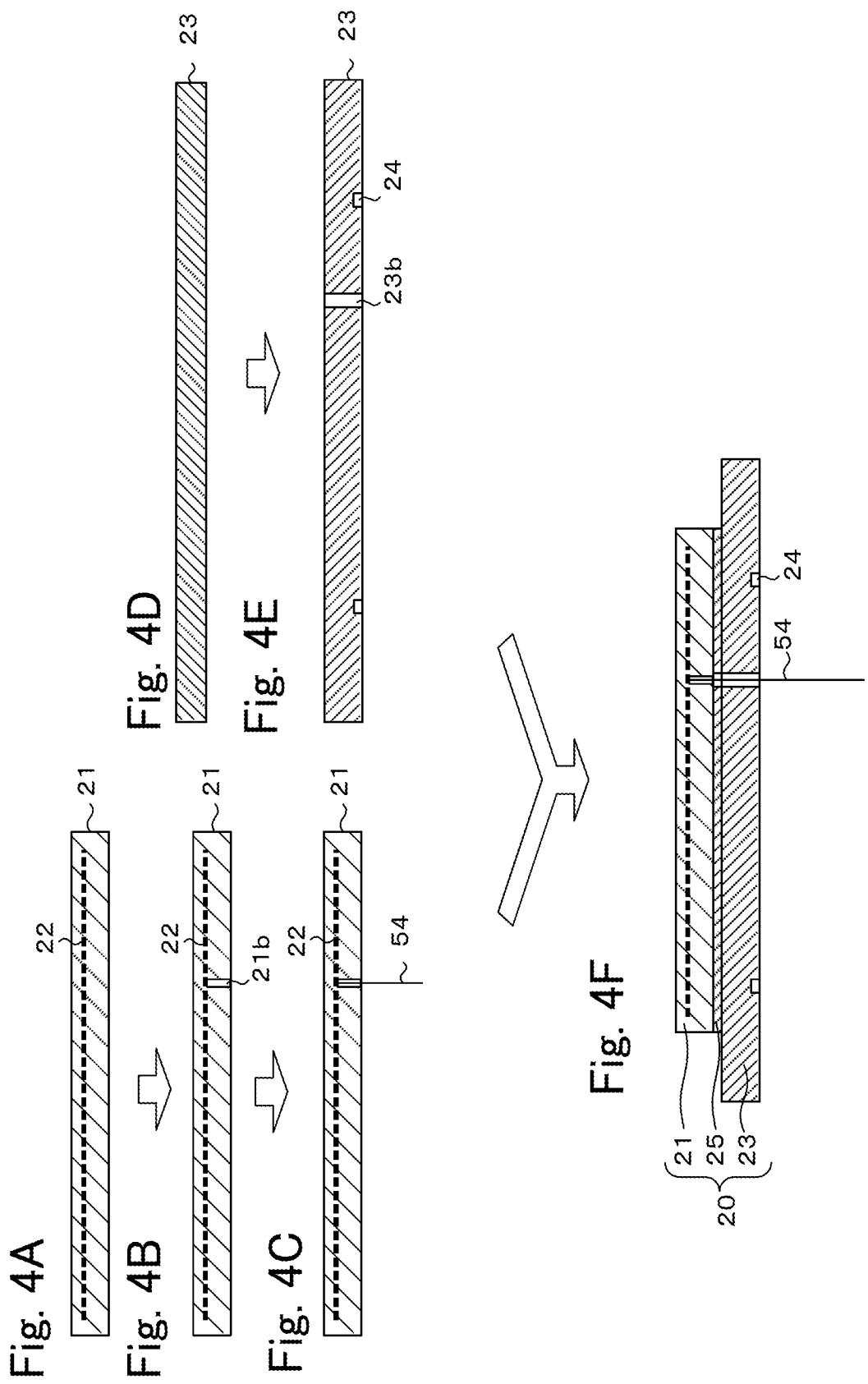

Fig. 5A
Fig. 5B
Fig. 5C
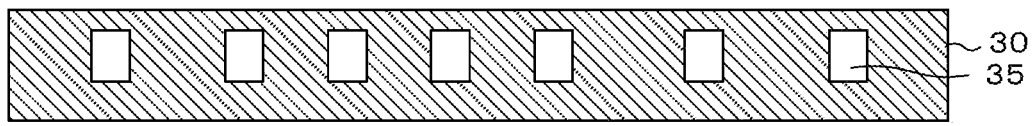
Fig. 5D
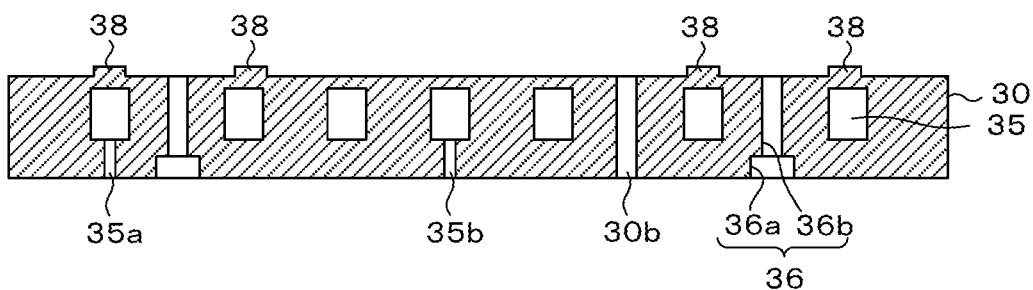

WAFER PLACEMENT TABLE WITH HEAT DISSIPATION SHEET

BACKGROUND OF THE INVENTION

1. Field of the Invention

The present invention relates to a wafer placement table.

2. Description of the Related Art

There is a known wafer placement table including a ceramic substrate having a wafer placement surface and incorporating an electrode, and a metal plate disposed on a surface of the ceramic substrate opposite to the wafer placement surface. Patent Literature 1 discloses that, in such a wafer placement table, a plurality of through holes are provided in the metal plate, screw holes are provided, in the lower surface of the ceramic substrate, at positions facing the through holes, and screw members are each inserted from the lower surface of the metal plate into a corresponding one of the through holes and are screwed into a corresponding one of the screw holes to fasten the ceramic substrate and the metal plate to each other. A non-adhesive thermally conductive sheet (a type of a heat dissipation sheet) is disposed between the ceramic substrate and the metal plate. The thermally conductive sheet serves a function of transferring the heat of the ceramic substrate to the metal plate.

CITATION LIST

Patent Literature

PTL 1: WO 2018/038044 A1

SUMMARY OF THE INVENTION

In Patent Literature 1, it is necessary in manufacture of the wafer placement table to avoid terminal holes and the like to position the thermally conductive sheet. There is, however, a case in which the thermally conductive sheet is displaced from its original position since no device for positioning the thermally conductive sheet is included. In addition, since the amount of deformation (eventually, the thermal conductivity) of the thermally conductive sheet depends on the degree of fastening by each screw member, if there is a variation in the degrees of fastening by the screw members, thermal uniformity of a wafer may deteriorate.

The present invention has been made to solve such problems, and a main object of the present invention is to facilitate positioning of a heat dissipation sheet in manufacture of a wafer placement table and improve thermal uniformity of a wafer.

[1] A wafer placement table includes: an upper substrate including a ceramic substrate that incorporates an electrode and having a wafer placement surface at an upper surface of the ceramic substrate; a lower substrate disposed on a side of a lower surface of the upper substrate and including a refrigerant flow path through which a refrigerant flow or a refrigerant flow-path groove constituting a side wall and a bottom of the refrigerant flow path; a through hole extending through the lower substrate in an up-down direction; a plurality of projections provided in a dot pattern at an entirety of an upper surface of the lower substrate and being in contact with the lower surface of the upper substrate or provided in a dot pattern at an entirety of the lower surface of the upper substrate and being in contact with the upper surface of the lower substrate; a heat dissipation sheet having a projection insertion hole into which the projections are to be inserted and being disposed in a compressed state between the upper substrate and the lower substrate; a screw hole provided, in the lower surface of the upper substrate, at a position facing the through hole; a screw member inserted from a lower surface of the lower substrate into the through hole and screwed into the screw hole.

In the wafer placement table, the heat dissipation sheet has a plurality of the projection insertion holes into which the plurality of projections are to be inserted. In manufacture of the wafer placement table, the projections provided in a dot pattern at the entirety of the upper surface of the lower substrate or at the entirety of the lower surface of the upper substrate are inserted into the projection insertion holes of the heat dissipation sheet. The heat dissipation sheet is thus easily positioned. The screw member is screwed until an interval between the upper substrate and the lower substrate coincides with the height of each projection. Consequently, the heat dissipation sheet disposed between the upper substrate and the lower substrate is compressed until the thickness of the entirety of the heat dissipation sheet becomes identical or substantially identical to the height of each projection. Therefore, the thermal conductivity of the heat dissipation sheet does not vary greatly depending on locations. Therefore, thermal uniformity of a wafer is improved.

In the present description, the present invention may be described using wordings, such as up-down, left-right, and front-rear. Up-down, left-right, and front-rear, however, merely indicate relative positional relationships. Therefore, when the orientation of the wafer placement table is changed, up-down may become left-right, and left-right may become up-down. Even such a case is included in the technical scope of the present invention.

[2] In the above-described wafer placement table (the wafer placement table described in [1] above), the upper substrate may include the ceramic substrate and a support substrate that is made of a metal or a metal ceramic composite material and that is joined to a lower surface of the ceramic substrate with a metal joint layer interposed between the lower surface of the ceramic substrate and the support substrate, and the screw hole may be provided in a lower surface of the support substrate. Consequently, the support substrate has excellent thermal conductivity compared with the ceramic substrate since the support substrate is made of a metal or a metal ceramic composite material. Therefore, the heat of the ceramic substrate can be conducted to the lower substrate efficiently.

[3] In the above-described wafer placement table (the wafer placement table described in [1] or [2] above), the through hole may be provided to extend through the projections. Consequently, there is no need to provide the heat dissipation sheet with communication holes in communication with the through holes, and the function of the heat dissipation sheet is thus sufficiently exerted.

[4] In the above-described wafer placement table (the wafer placement table described in any one of [1] to [3] above), thermal resistance of the heat dissipation sheet may be 0.35 K·cm²/W or less. Consequently, the heat of the upper substrate is conducted to the lower substrate immediately.

[5] In the above-described wafer placement table (the wafer placement table described in any one of [1] to [4] above), a Young's modulus of the heat dissipation sheet may be 100 MPa or less. Consequently, the fastening force of the screw member is uniformly transmitted to the entire surface of the heat dissipation sheet easily. The heat dissipation sheet is thus in close contact at the entire surface thereof with the upper substrate and the lower substrate firmly.

[6] In the above-described wafer placement table (the wafer placement table described in any one of [1] to [5] above), the through hole may be provided not to intersect with the refrigerant flow path or the refrigerant flow-path groove. Consequently, there is no likelihood of the refrigerant leaking out through the through hole into which the screw member is inserted.

[7] In the above-described wafer placement table (the wafer placement table described in any one of [1] to [5] above), the through hole may be provided to intersect with the refrigerant flow path or the refrigerant flow-path groove, and the lower substrate may include a refrigerant-leakage prevention member that prevents the refrigerant from leaking out to the lower surface of the lower substrate through the through hole into which the screw member is inserted. Consequently, there is no need to bypass the screw member to provide the refrigerant flow path. Therefore, flexibility in design of the refrigerant flow path or the refrigerant flow-path groove is increased. In addition, the refrigerant is prevented by the refrigerant leakage prevention member from leaking out through the through hole into which the screw member is inserted.

[8] In the above-described wafer placement table (the wafer placement table described in any one of [1] to [7] above), the lower substrate may be made of an easily machinable material. Consequently, it is possible to easily form the refrigerant flow path or the refrigerant flow-path groove in the lower substrate and thus is possible to reduce machining costs.

[9] The above-described wafer placement table (the wafer placement table described in any one of [1] to [8] above) may further includes a thermally conductive paste interposed at least one of between side surfaces of the projections and an inner peripheral surface of the projection insertion hole of the heat dissipation sheet or between top surfaces of the projections and the lower surface of the upper substrate. Consequently, heat conduction from the upper substrate to the lower substrate is accelerated.

BRIEF DESCRIPTION OF THE DRAWINGS

FIGS. 4A to 4F illustrate manufacturing processes (manufacturing processes of an upper substrate 20) of the wafer placement table 10.

FIGS. 5A to 5D illustrate manufacturing processes (manufacturing processes of a lower substrate 30) of the wafer placement table 10.

DETAILED DESCRIPTION OF THE INVENTION

Figure 1:
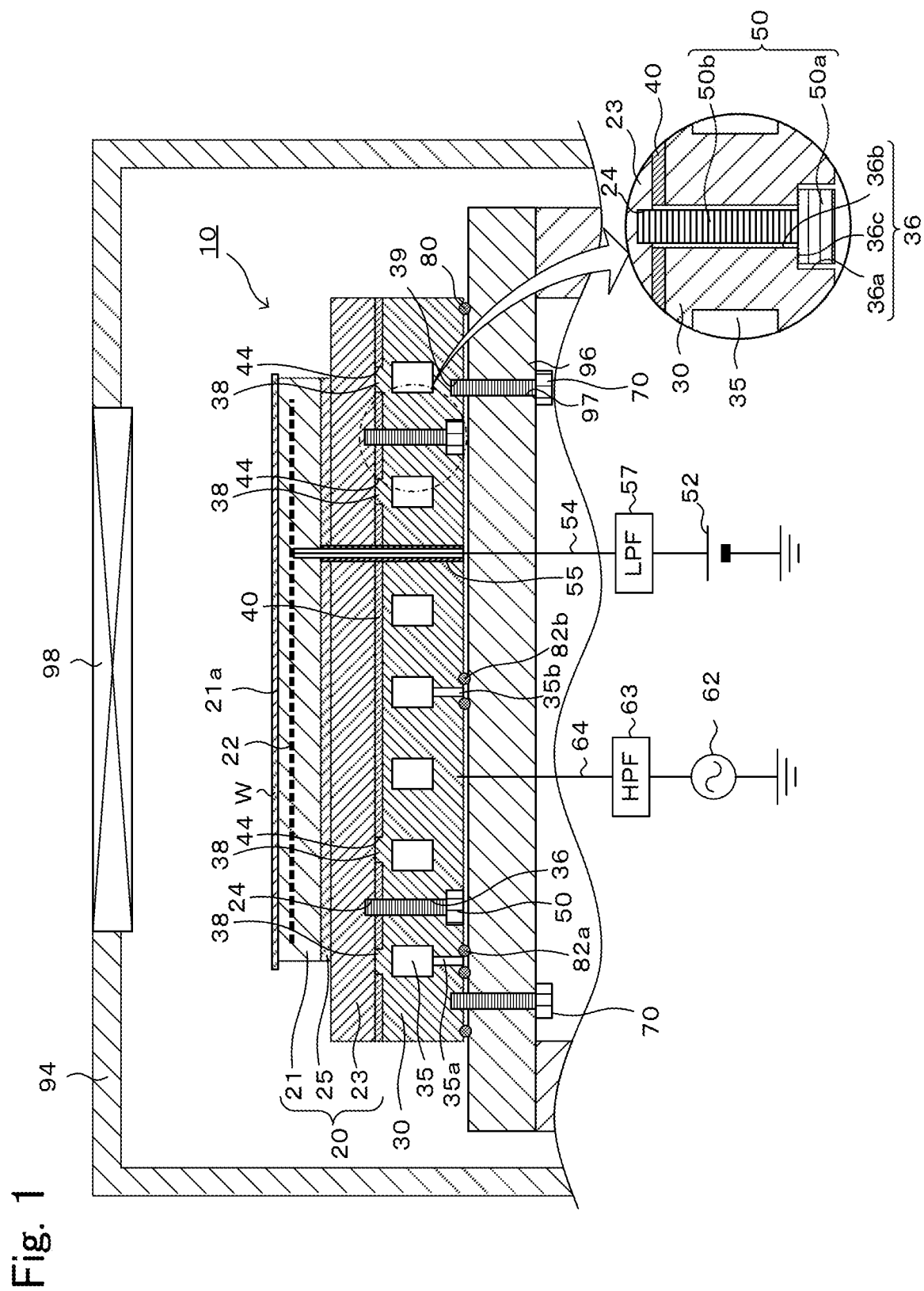
FIG. 1 is a vertical cross-sectional view of a wafer placement table 10 installed in a chamber 94.
Figure 2:
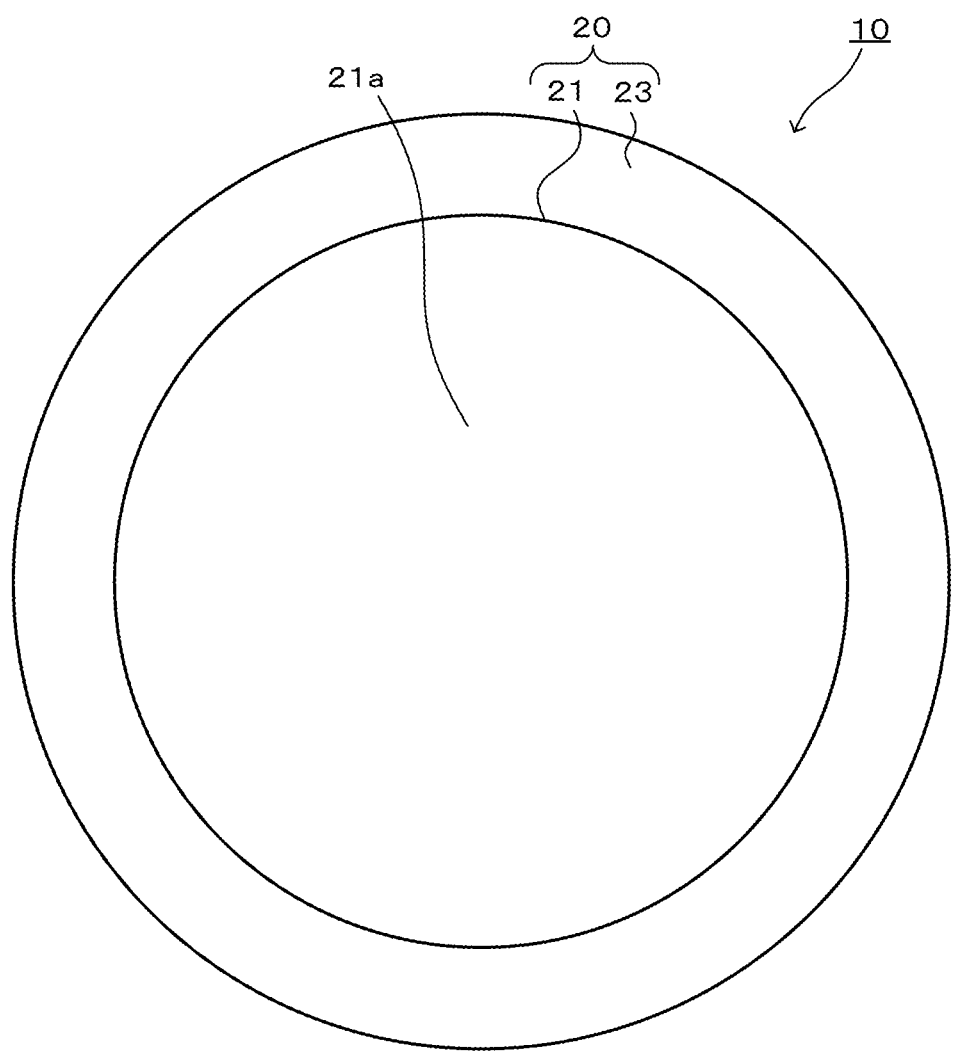
FIG. 2 is a plan view of the wafer placement table 10.
Figure 3:
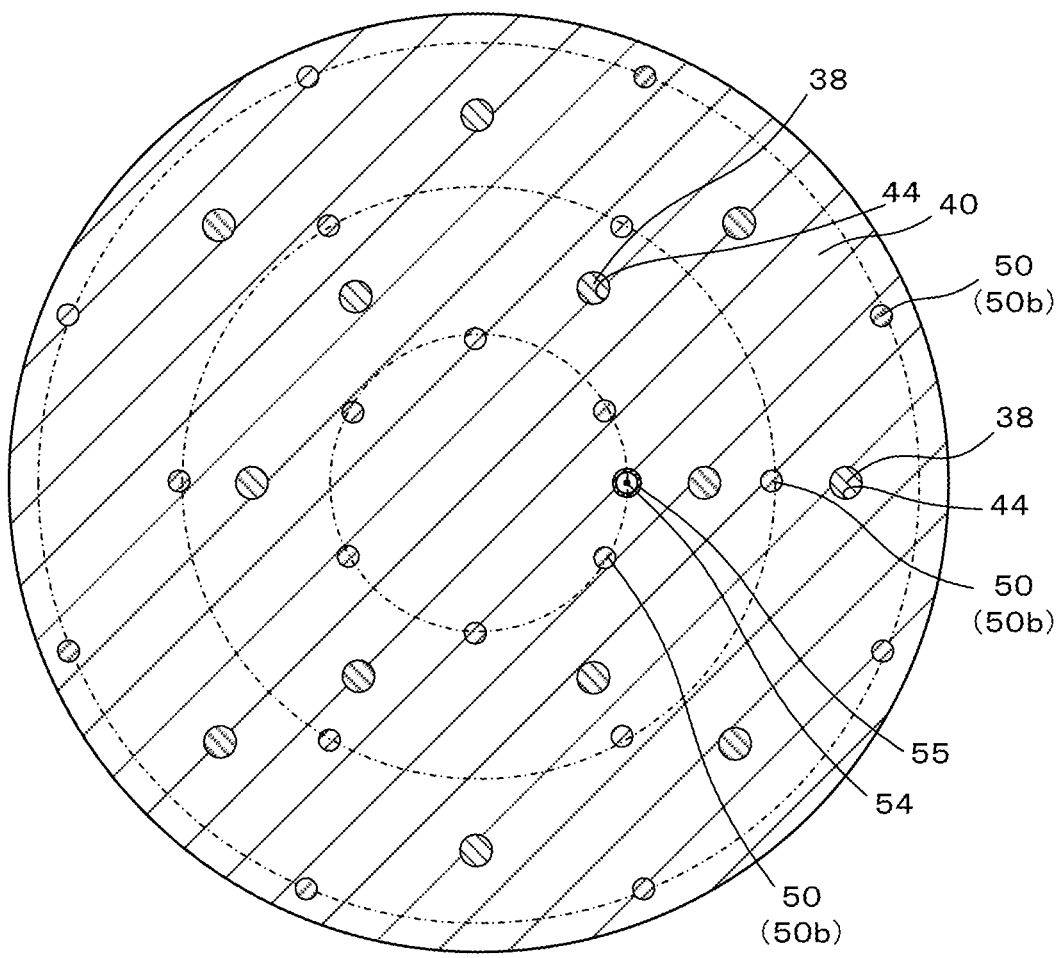
FIG. 3 is a sectional view in which a section obtained by cutting the wafer placement table 10 horizontally along a heat dissipation sheet 40 is viewed from above.

A suitable embodiment of the present invention will be described with reference to the drawings. FIG. 1 is a vertical cross-sectional view of a wafer placement table 10 installed in a chamber 94 (a sectional view of the wafer placement table 10 cut along a plane including the center axis of the wafer placement table 10). FIG. 2 is a plan view of the wafer placement table 10. FIG. 3 is a sectional view in which a section obtained by cutting the wafer placement table 10 horizontally along a heat dissipation sheet 40 is viewed from above.

The wafer placement table 10 is to be used for performing CVD, etching, or the like on a wafer W by using plasma, and is fixed to an installation plate 96 provided in an inner portion of the chamber 94 for semiconductor processing. The wafer placement table 10 includes an upper substrate 20, a lower substrate 30, the heat dissipation sheet 40, and screw members 50.

The upper substrate 20 includes a ceramic substrate 21, a support substrate 23 disposed on the lower side of the ceramic substrate 21, and a metal joint layer 25 joining the ceramic substrate 21 and the support substrate 23 to each other. The thickness of the upper substrate 20 is preferably 8 mm or more or 10 mm or more in consideration of strength thereof and is preferably 25 mm or less in consideration of cooling efficiency thereof.

The ceramic substrate 21 includes a wafer placement surface 21a having a circular shape. The wafer W is to be placed on the wafer placement surface 21a. The ceramic substrate 21 is made of a ceramic material represented by alumina, aluminum nitride, and the like. The ceramic substrate 21 incorporates a wafer attraction electrode 22 on a side close to the wafer placement surface 21a. The wafer attraction electrode 22 is made of a material containing, for example, W, Mo, WC, MoC, or the like. The wafer attraction electrode 22 is a unipolar electrostatic electrode having a disk shape or a mesh shape. In the ceramic substrate 21, a layer on the upper side of the wafer attraction electrode 22 functions as a dielectric layer. A wafer attraction direct-current power source 52 is connected to the wafer attraction electrode 22 with a power supply terminal 54 interposed therebetween. The power supply terminal 54 is provided to extend from the lower surface of the ceramic substrate 21 to the wafer attraction electrode 22 by passing through an insulating tube 55 disposed in a hole extending in the up-down direction through the lower substrate 30, the support substrate 23, and the metal joint layer 25. A low pass filter (LPF) 57 is provided between the wafer attraction direct-current power source 52 and the wafer attraction electrode 22.

The support substrate 23 is a disk slightly larger than the ceramic substrate 21 and is made of an electrically conductive material. Examples of the electrically conductive material are a composite material, a metal, and the like. An example of the composite material is a composite material of metal and ceramic, or the like. Examples of the composite material of metal and ceramic are a metal matrix composite material (MMC), a ceramic matrix composite material (CMC), and the like. Specific examples of such a composite material are a material containing Si, SiC, and Ti, a material in which Al and/or Si is impregnated in a SiC porous body, and the like. A material containing Si, SiC, and Ti is referred to as SiSiCTi, a material in which Al is impregnated in a SiC porous body is referred to as AlSiC, and a material in which Si is impregnated in a SiC porous body is referred to as SiSiC. An example of the metal is Mo or the like. The absolute value of a difference in the coefficient of linear thermal expansion at 40° C. to 400° C. between a material used in the support substrate 23 and a ceramic material used in the ceramic substrate 21 is preferably $1.5\times10^{-6}$/K or less, more preferably $1.0\times10^{-6}$/K or less, and further more preferably $0.5\times10^{-6}$/K or less. The thickness of the support substrate 23 is preferably 3 mm or more or 6 mm or more in consideration of strength thereof and is preferably 20 mm or less in consideration of cooling efficiency thereof.

The lower surface of the support substrate 23 is provided with a plurality of screw holes 24. The screw holes 24 are each provided at a position facing a corresponding one of through holes 36 described later. The screw holes 24 are formed by providing cylindrical holes in the lower surface of the support substrate 23 and forming a screw groove on each of the cylindrical holes directly. The screw holes 24 are, however, not particularly limited thereto. For example, the screw holes 24 may be each formed by inserting a helical screw insert into a cylindrical hole, or by inserting the female threaded terminal (for example, a cap nut) in Patent Literature 1 into a cylindrical hole and performing brazing thereon. An interval between the centers of two mutually adjacent screw holes 24 is preferably, for example, 100 mm or less but is not particularly limited.

The metal joint layer 25 joins the lower surface of the ceramic substrate 21 and the upper surface of the support substrate 23 to each other. The metal joint layer 25 may be, for example, a layer made of solder or a metal brazing material. The metal joint layer 25 is formed by, for example, TCB (thermal compression bonding). TCB is a publicly known method in which a metal joint material is sandwiched between two members that are objects to be joined and in which the two members in a state heated to a temperature less than or equal to the solidus temperature of the metal join material are pressurized and joined to each other.

The lower substrate 30 is a disk member made of an easily machinable material. In the present embodiment, the outer diameter of the lower substrate 30 is identical to the outer diameter of the support substrate 23. The lower substrate 30 incorporates a refrigerant flow path 35. The refrigerant flow path 35 is formed in a one-stroke pattern to have a spiral shape from an inlet 35a to an outlet 35b of the refrigerant flow path 35 so as to extend over an entire region in which the ceramic substrate 21 is disposed. The inlet 35a is provided near the outer periphery of the wafer placement table 10, and the outlet 35b is provided near the center of the wafer placement table 10. The inlet 35a and the outlet 35b are connected to a refrigerant cooling device, which is not illustrated. A refrigerant discharged through the outlet 35b is returned again to the inlet 35a after the temperature of the refrigerant is adjusted to be a predetermined low temperature in the refrigerant cooling device, and is supplied to the inside of the refrigerant flow path 35. Preferably, the refrigerant that flows in the refrigerant flow path 35 is a fluid and is electrically insulative. An example of the electrically insulative fluid is a fluorine-based inert fluid or the like. The easily machinable material used in the lower substrate 30 is preferably a material that is machinable more easily than the support substrate 23. As an index of machinability, for example, the machinability index presented in JIS B 0170 (2020) is usable. As the easily machinable material, a material having a machinability index of 40 or more is preferable, a material having a machinability index of 100 or more is more preferable, and a material having a machinability index of 140 or more is further preferable. Examples of the easily machinable material are aluminum, an aluminum alloy, stainless steel (SUS material), and the like.

The lower substrate 30 is connected to a RF power source 62 with a power supply terminal 64 interposed therebetween. The lower substrate 30 thus also functions as a radio frequency (RF) electrode for plasma generation. A high pass filter (HPF) 63 is disposed between the lower substrate 30 and the RF power source 62.

The lower substrate 30 has a plurality of the through holes 36. Each through hole 36 is a hole for inserting a corresponding one of the screw members 50 and extends through the lower substrate 30 in the up-down direction not to intersect with the refrigerant flow path 35. Each through hole 36 includes a large-diameter portion 36a for housing a head portion 50a of the screw member 50, and a small-diameter portion 36b allowing a leg portion 50b of the screw member 50 to pass therethrough while not allowing the head portion 50a to pass therethrough. As illustrated in FIG. 3, a plurality of projections 38 are provided in a dot pattern at the entirety of the upper surface of the lower substrate 30. At least one of the plurality of projections 38 is provided directly above the inlet 35a of the refrigerant flow path 35. The projections 38 may be, for example, flat cylindrical projections. The top surfaces of the projections 38 are in contact with the lower surface of the upper substrate 20 (that is, the lower surface of the support substrate 23). For example, the height of each projection 38 is preferably 0.05 mm or more and 1 mm or less and more preferably 0.1 mm or more and 0.5 mm or less. Preferably, the projections 38 are disposed not to be linearly arranged in the radial direction of the upper surface of the lower substrate 30.

The heat dissipation sheet 40 is disposed between the lower surface of the upper substrate 20 and the upper surface of the lower substrate 30. The heat dissipation sheet 40 has projection insertion holes 44 at positions each facing a corresponding one of the plurality of projections 38. The projection insertion holes 44 are holes that extend through the heat dissipation sheet 40 in the up-down direction. The projections 38 are each inserted into a corresponding one of the projection insertion holes 44. The thickness of the heat dissipation sheet 40 before assembled to the wafer placement table 10 is larger than the height of each projection 38 while the thickness of the heat dissipation sheet 40 after assembled to the wafer placement table 10 is equal to or substantially equal to the height of each projection 38. The heat dissipation sheet 40 is thus sandwiched between the upper substrate 20 and the lower substrate 30 and compressed in the up-down direction. Consequently, the heat dissipation sheet 40 is in close contact with the lower surface of the upper substrate 20 and the upper surface of the lower substrate 30 firmly. The heat of the upper substrate 20 is therefore conducted to the lower substrate 30 immediately. Preferably, the heat dissipation sheet 40 has electrical conductivity. The thermal resistance of the heat dissipation sheet 40 is preferably 0.35 K·cm$^2$/W or less and more preferably 0.1 K·cm$^2$/W or less. The Young's modulus of the heat dissipation sheet 40 is preferably 100 MPa or less, more preferably 20 MPa or less, and further preferably 5 MPa or less. The thermal resistance can be measured, for example, in accordance with ASTM D5470. The heat dissipation sheet 40 has no or almost no adhesiveness.

Specifically, the heat dissipation sheet 40 is preferably a sheet containing carbon and resin. Examples of the carbon are graphite, carbon fibers, carbon nanotubes, and the like, and example of the resin are a silicone resin and the like.

When graphite is employed, it is preferable to dispose the graphite such that the surface direction of graphene constituting the graphite is in the up-down direction. When the carbon fibers or the carbon nanotubes are employed, it is preferable to dispose the carbon fibers or the carbon nanotubes such that the axial direction thereof is in the up-down direction. As a material of the heat dissipation sheet 40, for example, a thermal interface material (TIM) is usable. Specific examples of the heat dissipation sheet 40 are EX20000C4S (manufactured by Dexerials Corporation), GraphitePAD and GraphiteTIM (registered trademarks) (both manufactured by Panasonic Corporation), and the like. The Poisson's ratio of the heat dissipation sheet 40 is preferably 0.4 or less, more preferably 0.3 or less, and further preferably 0.2 or less. As the Poisson's ratio of the heat dissipation sheet 40 is smaller, the fastening force of the screw members 50 is transmitted to the entire surface of the heat dissipation sheet 40 more uniformly and does not easily escape in the lateral direction. Therefore, the heat dissipation sheet 40 is in close contact at the entire surface thereof with the support substrate 23 and the lower substrate 30 firmly. It is thus possible to more uniformly cool the wafer W. The shore hardness (ShoreOO) of the heat dissipation sheet 40 may be 50 or more and 80 or less.

As illustrated in the enlarged view in FIG. 1, each screw member 50 includes the head portion 50*a* having a large diameter and the leg portion 50*b* having a small diameter. Each screw member 50 is inserted from the lower surface of the lower substrate 30 into a corresponding one of the through holes 36 that are provided not to intersect with the refrigerant flow path 35, and the screw member 50 is screwed into a corresponding one of the screw holes 24 of the support substrate 23. Each screw member 50 is screwed into the screw hole 24 until the top surfaces of the projections 38 of the lower substrate 30 come into contact with the lower surface of the upper substrate 20. As a result, the head portion 50*a* of the screw member 50 upwardly presses a step surface 36*c* (the boundary between the large-diameter portion 36*a* and the small-diameter portion 36*b*) of the through hole 36. The support substrate 23 of the upper substrate 20 and the lower substrate 30 are fastened to each other in a state of sandwiching the heat dissipation sheet 40, and the heat dissipation sheet 40 is compressed in the up-down direction. The head portion 50*a* of the screw member 50 is housed in the large-diameter portion 36*a* so as not to protrude downward from the lower surface of the lower substrate 30. As illustrated in FIG. 3, a large number of the screw members 50 are provided along a plurality (three in the present embodiment) of circles (dashed dotted lines in FIG. 3) concentric with the heat dissipation sheet 40 in the present embodiment. The material of the screw members 50 is preferably a material having favorable electrical conductivity and favorable thermal conductivity. For example, stainless steel is preferable.

The side surface (outer peripheral surface) of the metal joint layer 25, the upper surface and the side surface of the support substrate 23, and the side surface of the lower substrate 30 may be covered with an insulating film, as necessary. An example of the insulating film is a sprayed film of alumina, yttria, or the like. A metal or resin O-ring may be disposed to surround the outer periphery of the heat dissipation sheet 40. The O-ring is compressed in the up-down direction between the upper substrate 20 and the lower substrate 30 and exerts sealing performance. Consequently, the heat dissipation sheet 40 is protected by the O-ring.

Figure 6A:
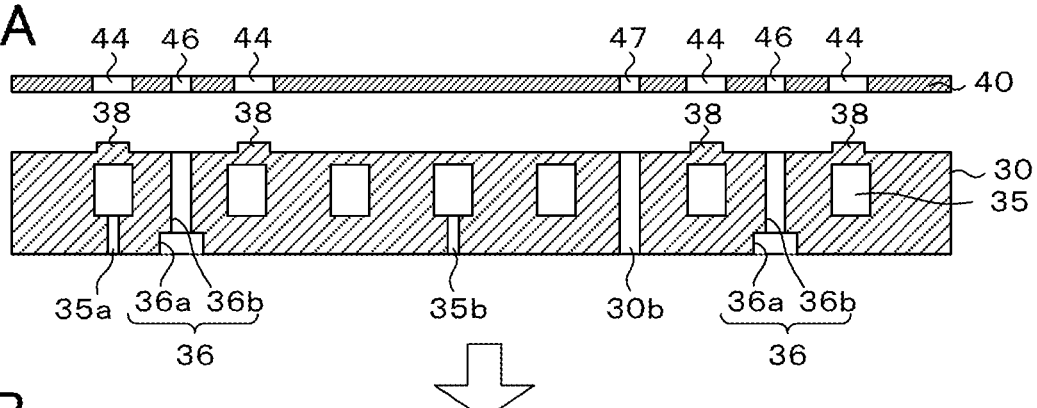
FIGS. 6A to 6C illustrate manufacturing processes (assembling processes of the wafer placement table 10) of the wafer placement table 10.
Figure 6B:
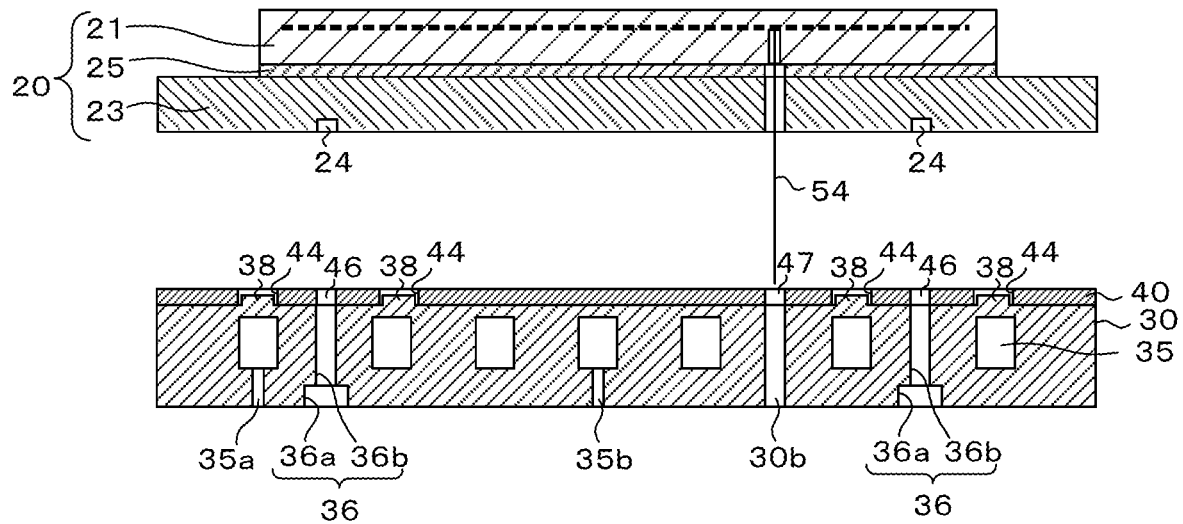
Figure 6C:
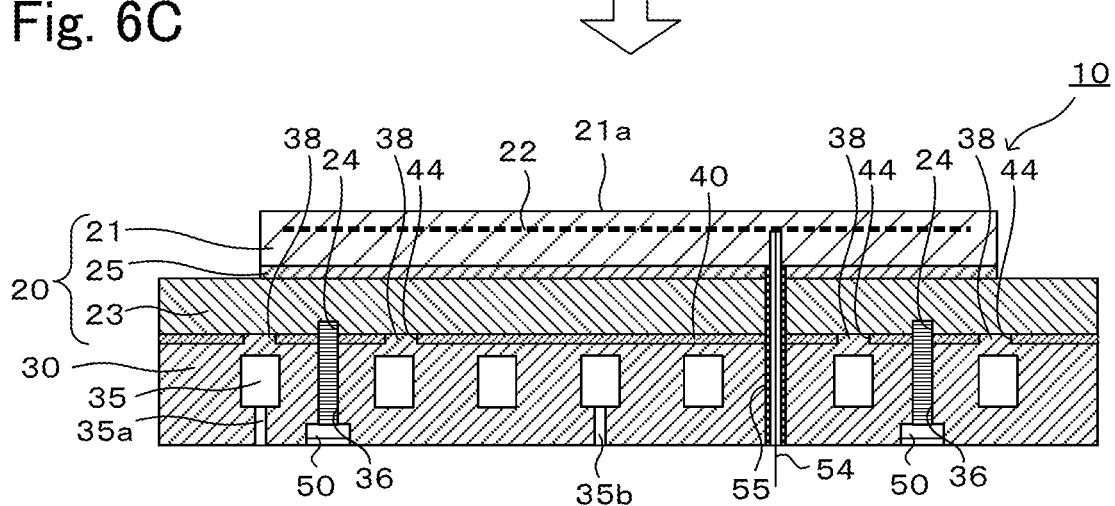

Next, an example of manufacture of the wafer placement table 10 will be described with reference to FIGS. 4A to 4F to FIGS. 6A to 6C. FIGS. 4A to 4F to FIGS. 6A to 6C illustrate manufacturing processes of the wafer placement table 10. FIGS. 4A to 4F illustrate a manufacturing processes of the upper substrate 20, FIGS. 5A to 5D illustrate manufacturing processes of the lower substrate 30, and FIGS. 6A to 6C illustrate assembling processes of the wafer placement table 10.

The upper substrate 20 is produced, for example, as follows. First, the ceramic substrate 21 is produced by subjecting a molded body of ceramic powder to hot press sintering (FIG. 4A). The ceramic substrate 21 incorporates the wafer attraction electrode 22. Next, a hole 21*b* is formed from the lower surface of the ceramic substrate 21 to the wafer attraction electrode 22 (FIG. 4B), and the power supply terminal 54 is inserted into the hole 21*b* to join the power supply terminal 54 and the wafer attraction electrode 22 to each other (FIG. 4C).

In parallel with this, the disk-shaped support substrate 23 is produced (FIG. 4D), a hole 23*b* extending through the support substrate 23 in the up-down direction is formed, and the screw holes 24 are formed at predetermined positions in the lower surface of the support substrate 23 (FIG. 4E). The hole 23*b* of the support substrate 23 is formed at a position that enables the hole 23*b* to be in communication with the hole 21*b* of the ceramic substrate 21. When the ceramic substrate 21 is made of alumina, the support substrate 23 is preferably made of SiSiCTi or AlSiC. This is because SiSiCTi or AlSiC can have a coefficient of thermal expansion substantially equal to the coefficient of thermal expansion of alumina.

The support substrate 23 made of SiSiCTi can be produced by, for example, as follows. First, silicon carbide, metal Si, and metal Ti are mixed to produce a powder mixture. Next, the obtained powder mixture is subjected to uniaxial pressure molding to produce a disk-shaped molded body, and the molded body is subjected to hot-press sintering under an inert atmosphere to obtain the support substrate 23 made of SiSiCTi.

Next, a circular metal joint material is disposed on the upper surface of the support substrate 23. The metal joint material is previously provided with a hole that is to be in communication with the hole 23*b* of the support substrate 23. Then, while the power supply terminal 54 of the ceramic substrate 21 is inserted into the hole of the metal joint material and the hole 23*b* of the support substrate 23, the ceramic substrate 21 is placed on the metal joint material. Consequently, a layered body in which the support substrate 23, the metal joint material, and the ceramic substrate 21 are layered in this order from the bottom is obtained. The upper substrate 20 is obtained by pressurizing the layered body while heating the layered body (TCB) (FIG. 4F). The upper substrate 20 is constituted by the ceramic substrate 21 that is joined to the upper surface of the support substrate 23 with the metal joint layer 25 interposed therebetween.

TCB is performed, for example, as follows. That is, the layered body is pressurized and joined at a temperature less than or equal to the solidus temperature of the metal joint material (for example, more than or equal to a temperature obtained by subtracting 20° C. from the solidus temperature and less than or equal to the solidus temperature). The layered body is then returned to room temperature. Consequently, the metal joint material becomes a metal joint layer (or an electrically conductive joint layer). As the metal joint material in this case, an Al—Mg joint material or an Al—Si—Mg joint material is usable. For example, when the Al—Si—Mg joint material is used to perform TCB, the layered body is pressurized in a state heated under a vacuum atmosphere. The metal joint material having a thickness of substantially 100 μm is preferably usable.

In parallel with the production of the upper substrate 20, the lower substrate 30 is produced with an easily machinable material, for example, as follows. First, two disk-shaped disk members 31 and 32 made of an easily machinable material and serving as a base of the lower substrate 30 are prepared (FIG. 5A). The disk members 31 and 32 are preferably made of aluminum, an aluminum alloy, or stainless steel. Next, a groove 35c that eventually serves as the refrigerant flow path 35 is formed on the lower surface of the disk member 31 on the upper side (FIG. 5B). Thereafter, the lower surface of the disk member 31 on the upper side and the upper surface of the disk member 32 on the lower side are joined to each other by a joint material (for example, a brazing material), which is not illustrated, to thereby produce the lower substrate 30 incorporating the refrigerant flow path 35 (FIG. 5C). Then, the inlet 35a and the outlet 35b extending from the lower surface of the lower substrate 30 to the bottom surface of the refrigerant flow path 35 in the up-down direction are formed, and a terminal hole 30b extending through the lower substrate 30 in the up-down direction is formed. Further, the through holes 36 each including the large-diameter portion 36a and the small-diameter portion 36b are formed at predetermined positions in the lower substrate 30, and the plurality of projections 38 are formed over the entirety of the upper surface of the lower substrate 30 (FIG. 5D).

Next, as illustrated in FIG. 6A and FIG. 6B, the heat dissipation sheet 40 is disposed on the upper surface of the lower substrate 30. The heat dissipation sheet 40 is a circular sheet having a diameter identical to the diameter of the lower substrate 30. The heat dissipation sheet 40 has, at positions facing the plurality of projections 38, the projection insertion holes 44 extending through the heat dissipation sheet 40 in the up-down direction. The heat dissipation sheet 40 also has, at positions facing the small-diameter portions 36b of the through holes 36 and a position facing the terminal hole 30b, holes 46 and 47 extending through the heat dissipation sheet 40 in the up-down direction. As a result of the projections 38 being inserted into the projection insertion holes 44, the heat dissipation sheet 40 is positioned such that the holes 46 face the small-diameter portions 36b and that the hole 47 faces the terminal hole 30b. In this state, the thickness of the heat dissipation sheet 40 is larger than the height of each projection 38. Gaps are present between the inner peripheral surfaces of the projection insertion holes 44 and the outer peripheral surfaces of the projections 38.

Next, while the power supply terminal 54 of the upper substrate 20 is inserted into the terminal hole 30b, the upper substrate 20 is placed on the heat dissipation sheet 40 disposed on the upper surface of the lower substrate 30. Next, the screw members 50 are each inserted from the lower surface of the lower substrate 30 into a corresponding one of the through holes 36 and screwed into a corresponding one of the screw holes 24 of the support substrate 23. The screw members 50 are screwed until the projections 38 come into contact with the lower surface of the support substrate 23. Consequently, the heat dissipation sheet 40 is compressed between the support substrate 23 and the lower substrate 30 substantially uniformly and exerts high heat-conduction performance. Thereafter, the insulating tube 55 into which the power supply terminal 54 is to be inserted is disposed in the terminal hole 30b (FIG. 6C). The wafer placement table 10 can be obtained as described above.

Next, a usage example of the wafer placement table 10 will be described with reference to FIG. 1. First, the wafer placement table 10 is installed on the installation plate 96 in the chamber 94. Specifically, seal members 80, 82a, and 82b are first disposed between the upper surface of the installation plate 96 and the lower surface of the lower substrate 30. The seal member 80 is a metal or resin ring having an outer diameter slightly smaller than the diameter of the lower substrate 30, and the seal member 80 can be compressed in the up-down direction. The seal members 82a and 82b are metal or resin rings disposed along the opening edges of the inlet 35a and the outlet 35b of the refrigerant flow path 35, respectively, and the seal members 82a and 82b can be compressed in the up-down direction. Next, a screw member 70 is screwed from the lower surface of the installation plate 96 through a screw insertion hole 97 into a screw hole 39 provided in the lower surface of the lower substrate 30. Consequently, the seal members 82a and 82b are compressed in the up-down direction and exert sealing performance to prevent a refrigerant from leaking out from the seal members 82a and 82b to the outer side.

The discoidal wafer W is placed on the wafer placement surface 21a of the wafer placement table 10 installed on the installation plate 96. In this state, a direct-current voltage of the wafer attraction direct-current power source 52 is applied to the wafer attraction electrode 22 to cause the wafer W to be attracted by the wafer placement surface 21a. A refrigerant whose temperature is adjusted is supplied through the inlet 35a of the refrigerant flow path 35, and the refrigerant is discharged through the outlet 35b. Then, the inside of the chamber 94 is set to be in a predetermined vacuum atmosphere (or a reduced-pressure atmosphere), and a RF voltage from the RF power source 62 is applied to the lower substrate 30 while a process gas is supplied from a shower head 98. Consequently, plasma is generated between the wafer W and the shower head 98. The plasma is used to form a CVD film or perform etching on the wafer W.

In the wafer placement table 10 described above, the heat dissipation sheet 40 has a plurality of the projection insertion holes 44 into which the plurality of projections 38 are to be inserted. In manufacture of the wafer placement table 10, the projections 38 provided in a dot pattern at the entirety of the upper surface of the lower substrate 30 are inserted into the projection insertion holes 44 of the heat dissipation sheet 40. The heat dissipation sheet 40 is thus positioned easily. The screw members 50 are screwed until the interval between the upper substrate 20 and the lower substrate 30 coincides with the height of each projection 38. Consequently, the heat dissipation sheet 40 disposed between the upper substrate 20 and the lower substrate 30 is compressed until the thickness of the entirety of the heat dissipation sheet 40 becomes identical or substantially identical to the height of each projection 38. Therefore, the thermal conductivity of the heat dissipation sheet 40 does not vary greatly depending on locations. Therefore, thermal uniformity of the wafer W is improved.

The upper substrate 20 includes the ceramic substrate 21 and the support substrate 23 that is made of a metal or a metal ceramic composite material and that is joined to the lower surface of the ceramic substrate 21 with the metal joint layer 25 interposed therebetween. The screw holes 24 are provided in the lower surface of the support substrate 23. Since the support substrate 23 is made of a metal or a metal ceramic composite material, the support substrate 23 has excellent thermal conductivity compared with the ceramic substrate 21. Therefore, the heat of the ceramic substrate 21 can be conducted to the lower substrate 30 efficiently.

In addition, at least one of the plurality of projections 38 is provided directly above the inlet 35a of the refrigerant flow path 35. In the upper substrate 20, a portion directly above the inlet 35a of the refrigerant flow path 35 is easily cooled by the refrigerant compared with the other portions. However, due to the projection 38 provided directly above the inlet 35a of the refrigerant flow path 35, excessive cooling by the refrigerant can be suppressed.

Furthermore, the through holes 36 of the lower substrate 30 are provided not to intersect with the refrigerant flow path 35. Therefore, there is no likelihood of the refrigerant leaking out through the through holes 36 into which the screw members 50 are inserted.

In addition, the lower substrate 30 is made of an easily machinable material. Consequently, the refrigerant flow path 35 and the projections 38 can be easily formed at the lower substrate 30. It is thus possible to reduce machining costs. Further, material costs can be suppressed to be low compared with when the lower substrate 30 is made of a composite material of metal and ceramic (for example, MMC or CMC).

The thermal resistance of the heat dissipation sheet 40 is preferably 0.35 K·cm$^2$/W or less. Consequently, the heat of the upper substrate is conducted to the lower substrate immediately. The Young's modulus of the heat dissipation sheet 40 is preferably 100 MPa or less. Consequently, the fastening force of the screw members 50 is uniformly transmitted to the entire surface of the heat dissipation sheet 40 easily. The heat dissipation sheet 40 is thus in close contact at the entire surface thereof with the upper substrate 20 and the lower substrate 30 firmly.

The absolute value of a difference in the coefficient of linear thermal expansion at 40° C. to 400° C. between the support substrate 23 and the ceramic substrate 21 is preferably 1.5×10$^{-6}$/K or less. Consequently, a difference in the thermal expansion between the ceramic substrate 21 and the support substrate 23 is small. It is thus possible to suppress a warp and damage of the upper substrate 20 caused by thermal stress and also possible to suppress damage of the metal joint layer 25 joining the ceramic substrate 21 and the support substrate 23 to each other. The metal joint layer 25 causes favorable heat conduction between the ceramic substrate 21 and the support substrate 23 compared with resin.

The support substrate 23 is preferably made of a composite material of metal and ceramic. The composite material of metal and ceramic can reduce the absolute value of a difference in the coefficient of linear thermal expansion between the ceramic substrate 21 and the support substrate 23. In addition, due to having higher toughness than ceramic materials, the composite material of metal and ceramic is less likely to be damaged even when thermal stress is generated. In addition, such a composite material has electrical conductivity and thus is usable as a RF electrode.

The heat dissipation sheet 40 preferably has electrical conductivity. Consequently, the lower substrate 30 has an electrical potential identical to those of the support substrate 23 and the metal joint layer 25. It is thus possible to use the support substrate 23 and the metal joint layer 25 as RF electrodes, and plasma is easily generated above the wafer W. The screw members 50 having electrical conductivity may be used to cause the lower substrate 30 and the support substrate 23 to have an identical potential through the screw members 50.

Needless to say, the present invention is not limited to the above-described embodiment at all and can be embodied in various forms as long as the forms belong to the technical scope of the present invention.

Figure 7:
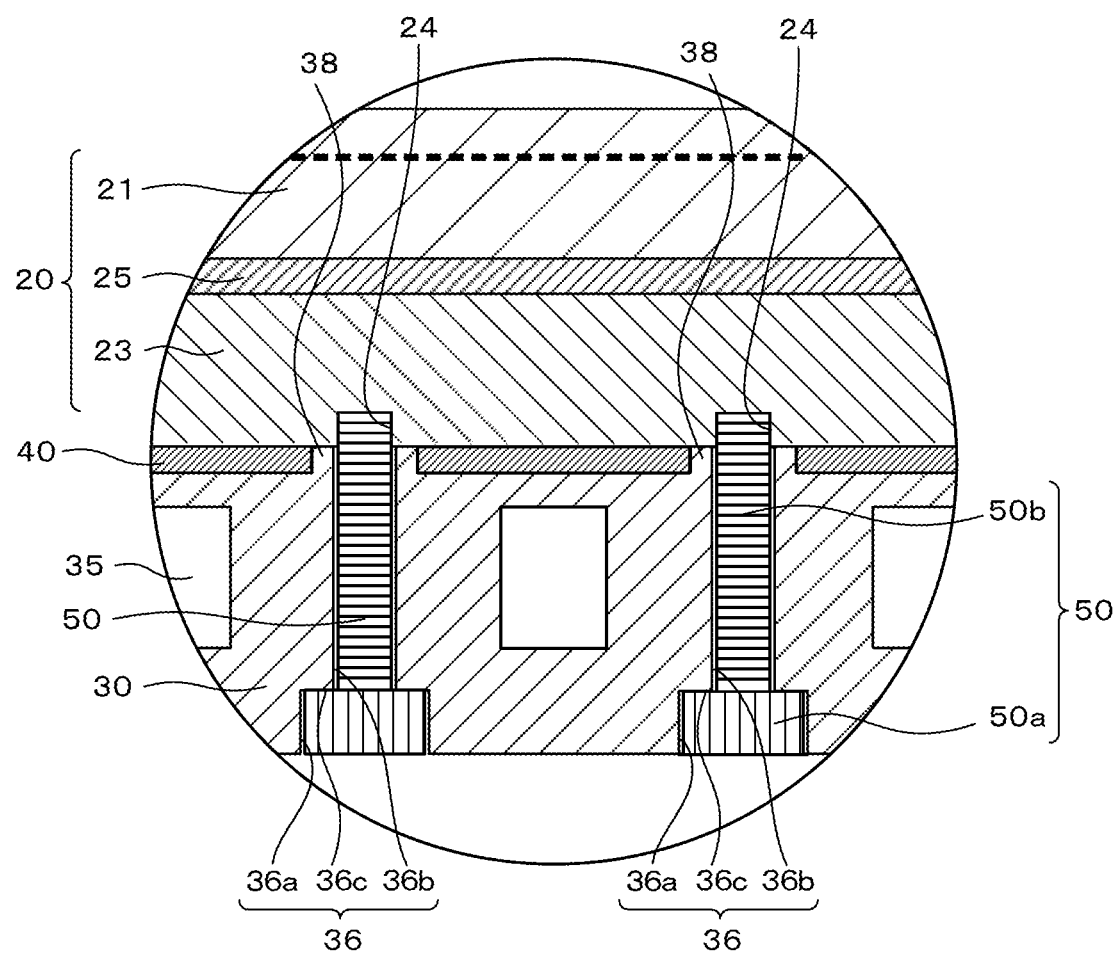
FIG. 7 is a partially enlarged sectional view of a different example in which through holes 36 are provided to extend through projections 38.

In the embodiment described above, the through holes 36 extending through the lower substrate 30 in the up-down direction are provided not to extend through the projections 38 of the lower substrate 30. The through holes 36 are, however, not particularly limited thereto. For example, as illustrated in FIG. 7, the through holes 36 may be provided to extend through the projections 38. Consequently, there is no need to provide the heat dissipation sheet 40 with communication holes (the holes 46 in FIGS. 6A and 6B) in communication with the through holes 36. The function of the heat dissipation sheet 40 is thus sufficiently exerted. In FIG. 7, components identical to those in the above-described embodiment are given identical signs.

Figure 8:
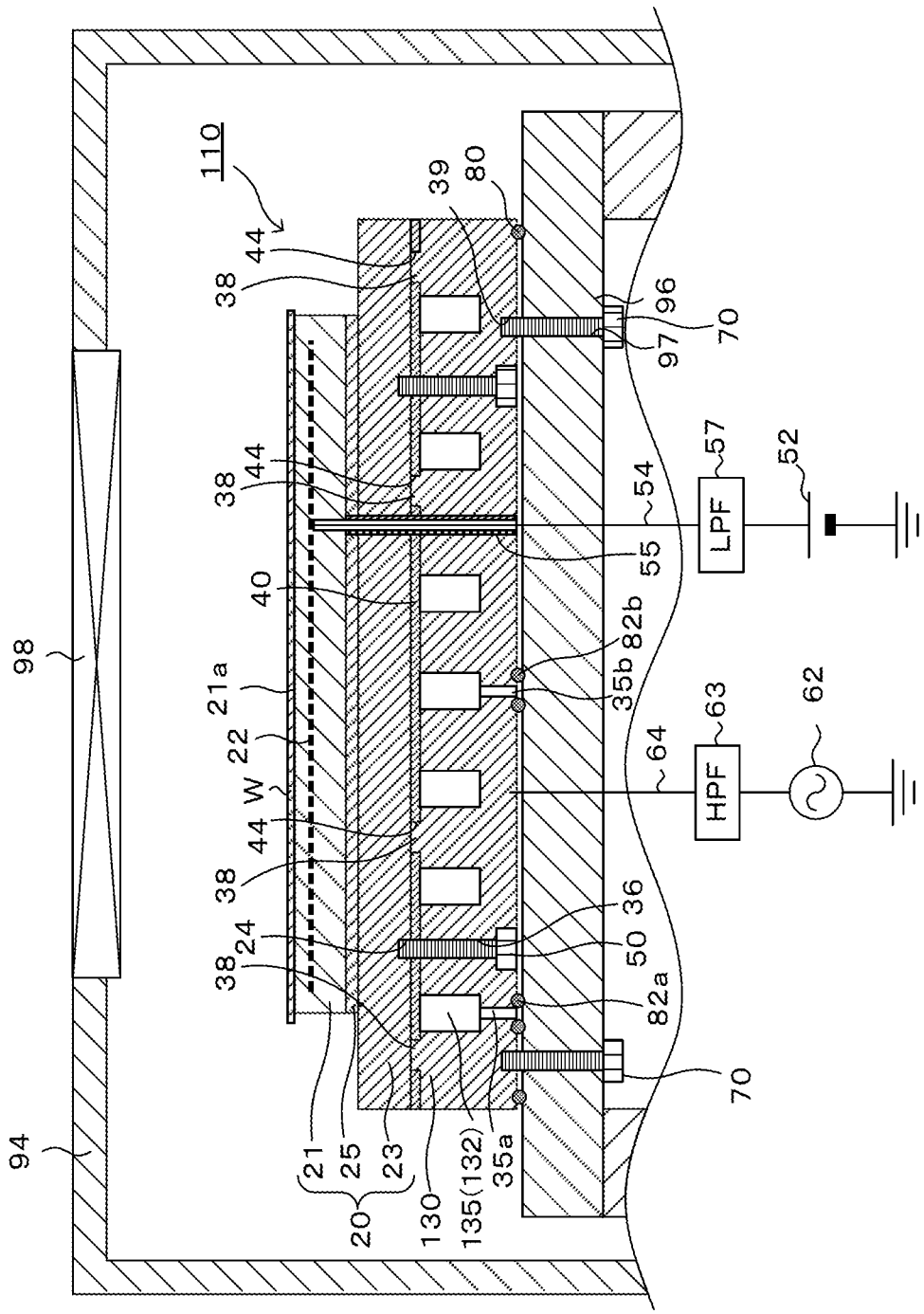
FIG. 8 is a vertical cross-sectional view of a wafer placement table 110.

In the above-described embodiment, the lower substrate 30 incorporates the refrigerant flow path 35. The lower substrate 30 is, however, not particularly limited thereto. For example, as in a wafer placement table 110 illustrated in FIG. 8, a lower substrate 130 may have a refrigerant flow-path groove 132 opening in the upper surface of the lower substrate 130. In this case, a refrigerant flow path 135 is formed as a result of the opening of the refrigerant flow-path groove 132 being covered by the heat dissipation sheet 40. The refrigerant flow-path groove 132 constitutes the side wall and the bottom of the refrigerant flow path 135, and the heat dissipation sheet 40 constitutes the ceiling of the refrigerant flow path 135. Consequently, the lower substrate 130 can be formed by processing a single sheet of a disk member. In FIG. 8, components identical to those in the above-described embodiment are given identical signs.

Figure 9:
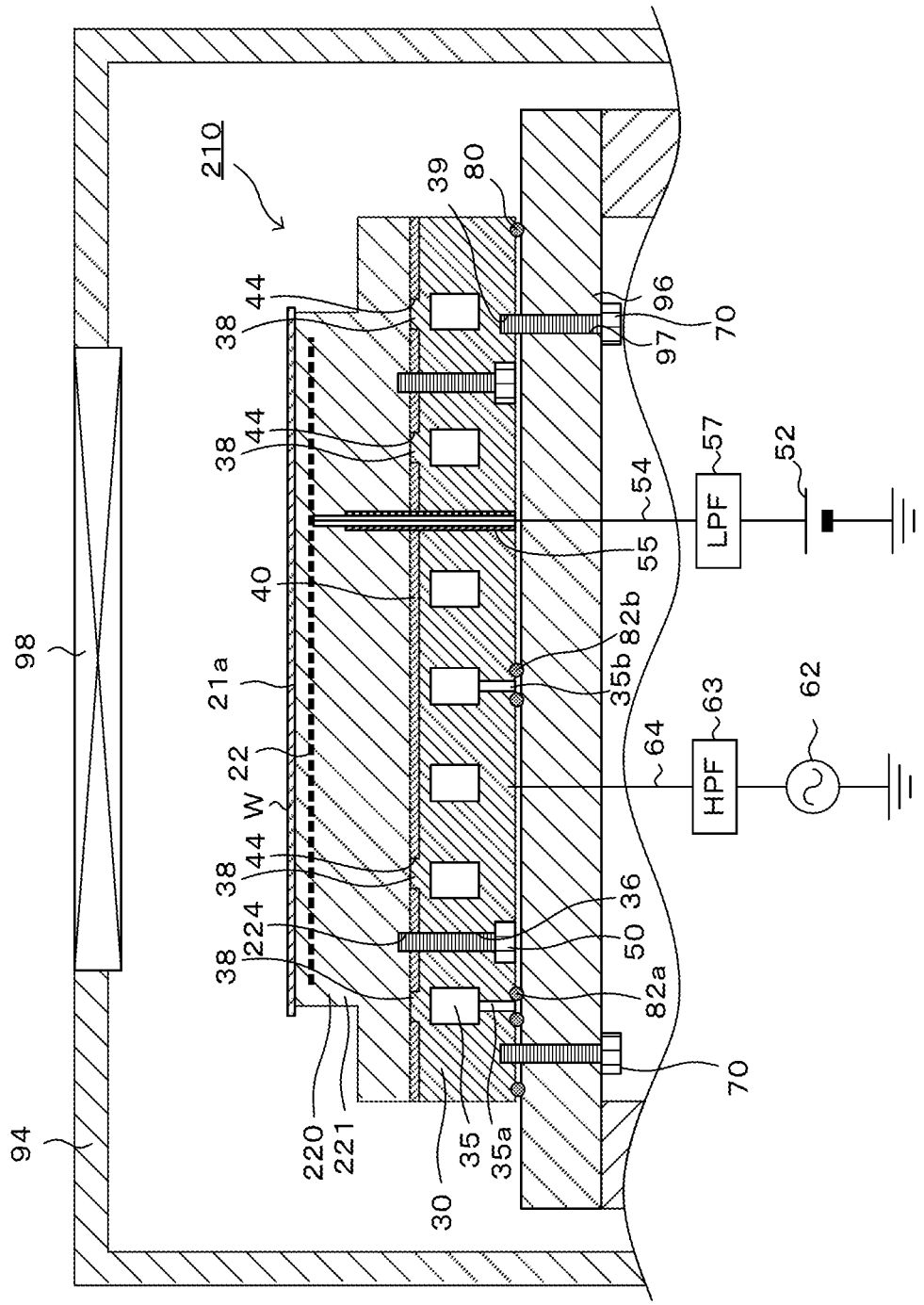
FIG. 9 is a vertical cross-sectional view of a wafer placement table 210.

In the above-described embodiment, the upper substrate 20 includes the ceramic substrate 21 and the support substrate 23 joined to the lower surface of the ceramic substrate 21 with the metal joint layer 25 interposed therebetween, and the screw holes 24 are provided in the lower surface of the support substrate 23. The upper substrate 20 and the screw holes 24 are, however, not particularly limited thereto. For example, as in a wafer placement table 210 illustrated in FIG. 9, an upper substrate 220 may be formed only by a ceramic substrate 221. In this case, screw holes 224 into which the screw members 50 are to be screwed are provided in the lower surface of the ceramic substrate 221. In FIG. 9, components identical to those in the above-described embodiment are given identical signs.

Figure 10:
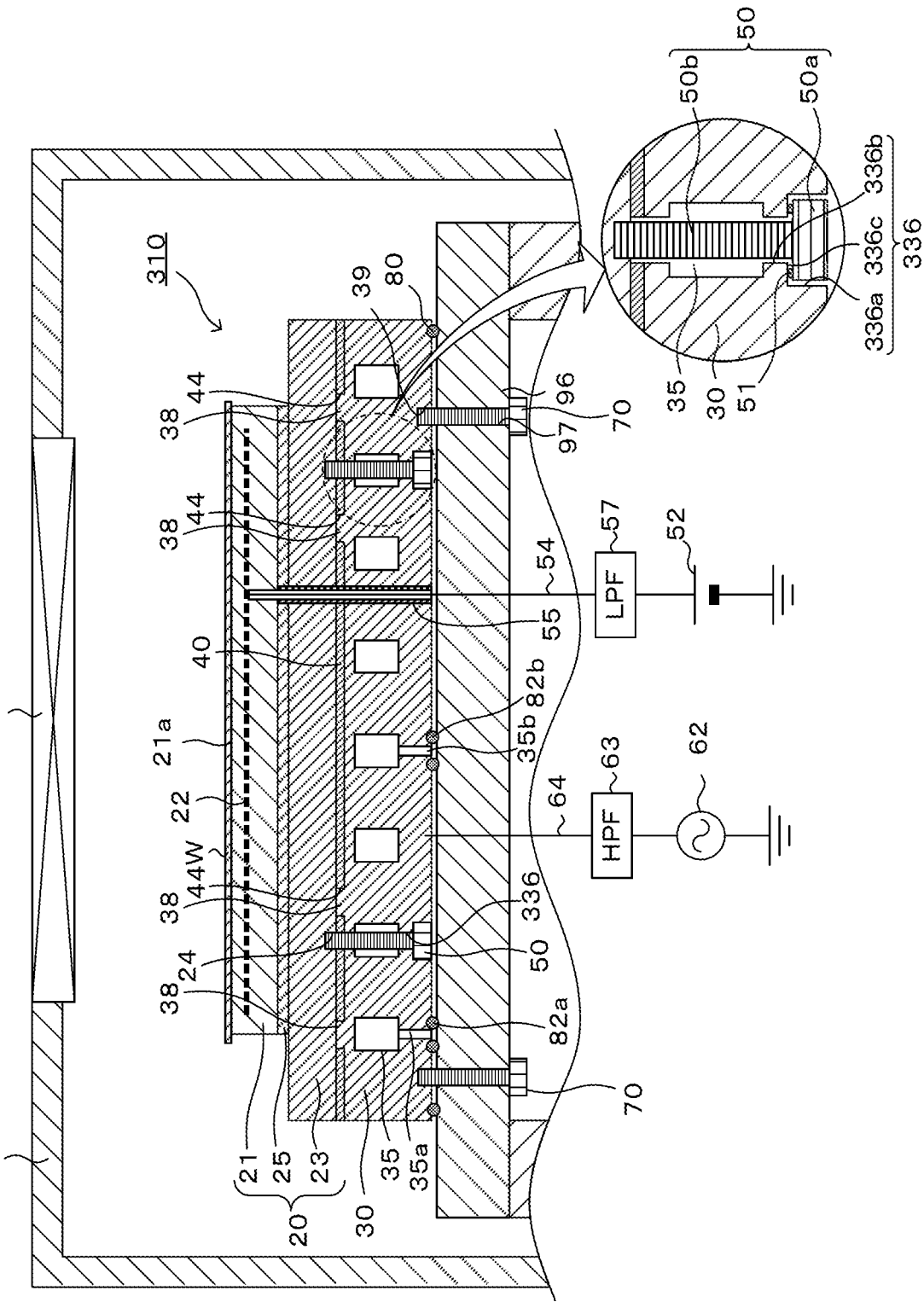
FIG. 10 is a vertical cross-sectional view of a wafer placement table 310.

In the above-described embodiment, the through holes 36 of the lower substrate 30 are provided not to intersect with the refrigerant flow path 35. The through holes 36 are, however, not particularly limited thereto. For example, as in a wafer placement table 310 illustrated in FIG. 10, through holes 336 may be provided to intersect with the refrigerant flow path 35. Each through hole 336 includes, as in the above-described embodiment, a large-diameter portion 336a and a small-diameter portion 336b. A resin or metal O-ring 51 is disposed at a step surface 336c (the boundary between the large-diameter portion 336a and the small-diameter portion 336b) of the through hole 336. The O-ring 51 is a refrigerant leakage prevention member and is compressed by the step surface 336c of the through hole 336 and the head portion 50a of the screw member 50 in the up-down direction. Consequently, there is no need to bypass the screw members 50 to provide the refrigerant flow path 35. Therefore, flexibility in design of the refrigerant flow path 35 is increased. In addition, the O-ring 51 prevents the refrigerant from leaking out to the lower surface of the lower substrate 30 through the through holes 336 into which the screw members 50 are inserted. In FIG. 10, components identical to those in the above-described embodiment are given identical signs. Also in FIG. 8 described above, the through holes 36 may be provided to intersect with the refrigerant flow-path groove 132.

Figure 11A:
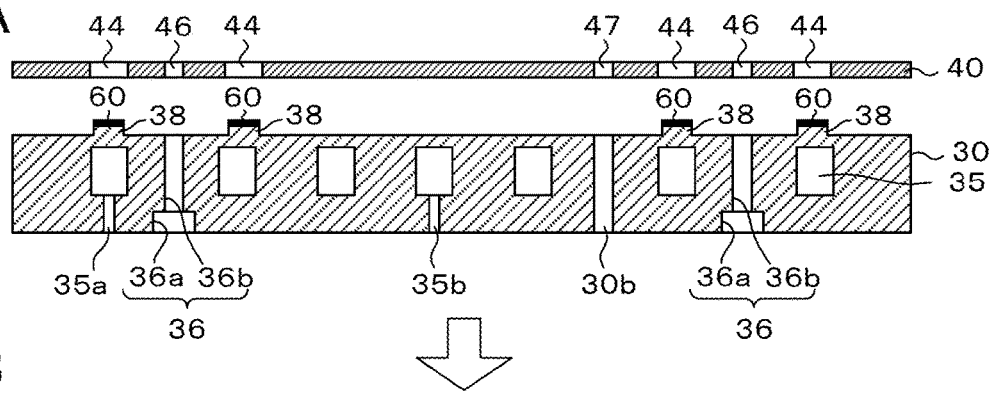
FIGS. 11A to 11C illustrate manufacturing processes of a wafer placement table 410.
Figure 11B:
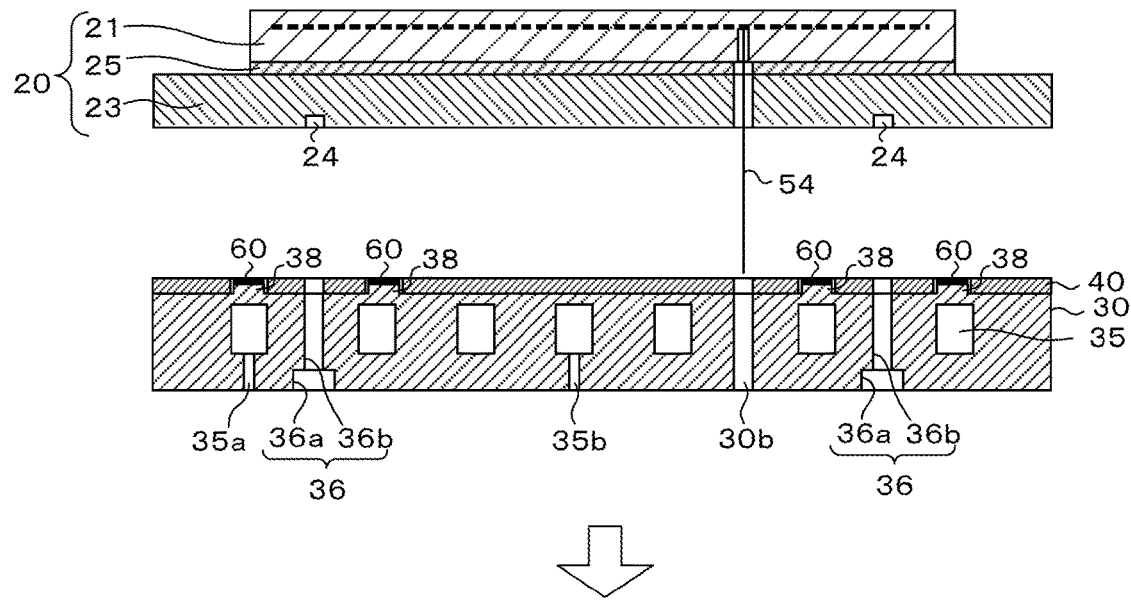
Figure 11C:
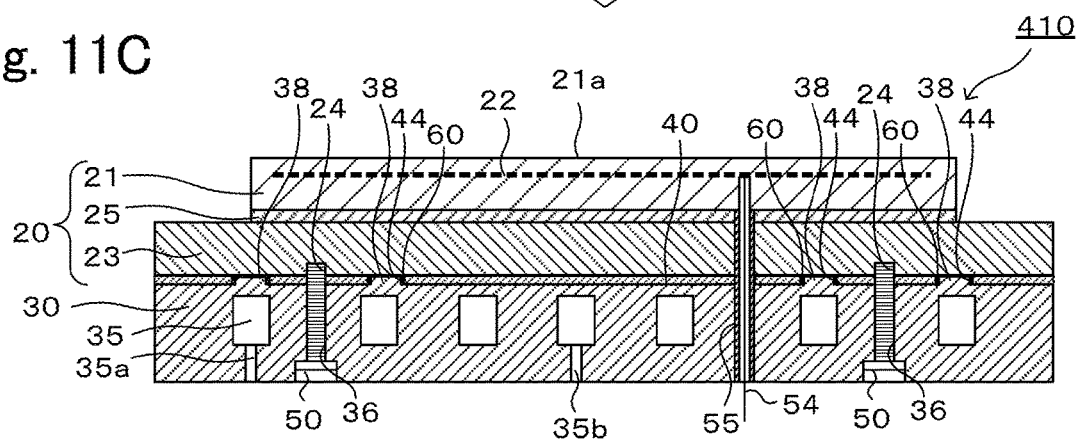

In the above-described embodiment, nothing is filled between the side surfaces of the projections 38 and the inner peripheral surfaces of the projection insertion holes 44 of the heat dissipation sheet 40 and between the top surfaces of the projections 38 and the lower surface of the upper substrate 20 (the lower surface of the support substrate 23). It is, however, not particularly limited thereto. For example, as in a wafer placement table 410 illustrated in FIG. 11C, the thermally conductive paste 60 may be interposed between the side surfaces of the projections 38 and the inner peripheral surfaces of the projection insertion holes 44 of the heat dissipation sheet 40 and between the top surfaces of the projections 38 and the lower surface of the upper substrate 20 (the lower surface of the support substrate 23). In FIGS. 11A to 11C, components identical to those in the above-described embodiment are given identical signs. In order to produce the wafer placement table 410, as illustrated in FIG. 11A, the thermally conductive paste 60 is applied to the top surfaces of the projections 38, and thereafter, as illustrated in FIG. 11B, the heat dissipation sheet 40 is disposed on the upper surface of the lower substrate 30. In this state, gaps are present between the inner peripheral surfaces of the projection insertion holes 44 and the outer peripheral surfaces of the projections 38. Next, while the power supply terminal 54 of the upper substrate 20 is inserted into the terminal hole 30b, the upper substrate 20 is placed on the heat dissipation sheet 40 disposed on the upper surface of the lower substrate 30. Next, the screw members 50 are each inserted from the lower surface of the lower substrate 30 into a corresponding one of the through holes 36 and screwed into a corresponding one of the screw holes 24 of the support substrate 23. The screw members 50 are screwed until the projections 38 come into contact with the lower surface of the support substrate 23.

Consequently, the heat dissipation sheet 40 is compressed between the support substrate 23 and the lower substrate 30 substantially uniformly and exerts high heat-conduction performance. At the same time, the thermally conductive paste 60 applied to the top surfaces of the projections 38 enters the gaps between the inner peripheral surfaces of the projection insertion holes 44 and the outer peripheral surfaces of the projections 38. Therefore, compared with when cavities remain in the gaps, heat conduction from the upper substrate 20 to the lower substrate 30 is accelerated. Part of the thermally conductive paste 60 remains between the top surfaces of the projections 38 and the support substrate 23. The top surfaces of the projections 38 have minute irregularities. The irregularities are, however, filled with the thermally conductive paste 60. Therefore, compared with when the minute irregularities remain as they are on the top surfaces of the projections 38, heat conduction from the upper substrate 20 to the lower substrate 30 is accelerated. As the thermally conductive paste 60, paste having thermal conductivity of 0.5 W/mK or more is preferable, paste having thermal conductivity of 1 W/mK or more is more preferable, and paste having thermal conductivity of 2 W/mK or more is further preferable. Examples of such paste are Tran-Q clay (thermal conductivity 2.8 W/mK) manufactured by NOK Corporation, BERGQUIST TLF 6000HG (thermal conductivity 6.0 W/mK) manufactured by Henkel Corporation, X-23-7921-5 (thermal conductivity 6.0 W/mK) manufactured by Shin-Etsu Chemical Co., Ltd., and the like.

In the above-described embodiment, the projections 38 are provided in a dot pattern at the entirety of the upper surface of the lower substrate 30. The projections 38 are, however, not particularly limited thereto. For example, instead of being provided on the upper surface of the lower substrate 30, the projections 38 may be provided in a dot pattern at the entirety of the lower surface of the upper substrate 20 (the lower surface of the support substrate 23), and the top surfaces of the projections may be in contact with the upper surface of the lower substrate 30. Even in this case, the heat dissipation sheet 40 disposed between the upper substrate 20 and the lower substrate 30 is compressed until the thickness of the entirety of the heat dissipation sheet 40 becomes identical or substantially identical to the height of each projection. Therefore, the thermal conductivity of the heat dissipation sheet 40 does not vary greatly depending on locations, and thermal uniformity of the wafer W is improved.

In the above-described embodiment, the heat dissipation sheet 40 having electrical conductivity is presented as an example. The heat dissipation sheet 40, however, may be electrically insulative.

In the above-described embodiment, the ceramic substrate 21 incorporates the wafer attraction electrode 22. However, the ceramic substrate 21 may incorporate, instead of or in addition to the wafer attraction electrode 22, a RF electrode for plasma generation. In this case, a high-frequency power source is connected to the RF electrode, not to the lower substrate 30. The ceramic substrate 21 may incorporate a heater electrode (resistance heating element). In this case, a heater power source is connected to the heater electrode. The ceramic substrate 21 may incorporate a single layer of an electrode and may incorporate two or more layers of an electrode.

In the above-described embodiment, the refrigerant flow path 35 is provided in a spiral shape from the inlet 35a to the outlet 35b. The shape of the refrigerant flow path 35 is, however, not particularly limited.

In the above-described embodiment, the ceramic substrate 21 is produced by subjecting a molded body of ceramic powder to hot press sintering. The molded body in this case may be produced by layering a plurality of tape molded bodies, may be produced by a mold casting method, and may be produced by compacting ceramic powder.

In the above-described embodiment, the lower substrate 30 is made of an easily machinable material. The lower substrate 30 is, however, not particularly limited thereto. For example, the lower substrate 30 may be made of a composite material of metal and ceramic. However, in consideration of material costs, using an easily machinable material, such as aluminum or an aluminum alloy, is preferable.

In the wafer placement table 10 in the above-described embodiment, a hole extending through the wafer placement table 10 from the lower surface of the lower substrate 30 to the wafer placement surface 21a may be provided. Examples of such a hole are a gas supply hole for supplying a thermally conductive gas (for example, a He gas) to the back side of the wafer W, a lift pin hole for inserting a lift pin that moves the wafer W upward and downward with respect to the wafer placement surface 21a, and the like. Preferably, a resin or metal O-ring is disposed at a portion where a gas supply hole or a lift pin hole extends through the heat dissipation sheet 40.

International Application No. PCT/JP2022/033051, filed on Sep. 2, 2022, is incorporated herein by reference in its entirety.

What is claimed is:

1. A wafer placement table comprising:
an upper substrate including a ceramic substrate that incorporates an electrode and having a wafer placement surface at an upper surface of the ceramic substrate;
a lower substrate disposed on a side of a lower surface of the upper substrate and including a refrigerant flow path through which a refrigerant flow or a refrigerant flow-path groove constituting a side wall and a bottom of the refrigerant flow path;
a through hole extending through the lower substrate in an up-down direction;
a plurality of projections provided in a dot pattern at an entirety of an upper surface of the lower substrate and being in contact with the lower surface of the upper substrate or provided in a dot pattern at an entirety of the lower surface of the upper substrate and being in contact with the upper surface of the lower substrate;
a heat dissipation sheet having a plurality of projection insertion holes that extend through the thickness of the heat dissipation sheet in the up-down direction and into which the plurality of projections are to be inserted and being disposed in a compressed state between a full width of the upper substrate and the lower substrate in vertical cross-sectional view of the wafer placement table;
a screw hole provided, in the lower surface of the upper substrate, at a position facing the through hole;
a screw member inserted from a lower surface of the lower substrate into the through hole and screwed into the screw hole.

2. The wafer placement table according to claim 1, wherein the upper substrate includes the ceramic substrate and a support substrate that is made of a metal or a metal ceramic composite material and that is joined to a lower surface of the ceramic substrate with a metal joint layer interposed between the lower surface of the ceramic substrate and the support substrate, and
wherein the screw hole is provided in a lower surface of the support substrate.

3. The wafer placement table according to claim 1, wherein the through hole is provided to extend through the plurality of projections.

4. The wafer placement table according to claim 1, wherein thermal resistance of the heat dissipation sheet is 0.35 K·cm$^2$/W or less.

5. The wafer placement table according to claim 1, wherein a Young's modulus of the heat dissipation sheet is 100 MPa or less.

6. The wafer placement table according to claim 1, wherein the through hole is provided not to intersect with the refrigerant flow path or the refrigerant flow-path groove.

7. The wafer placement table according to claim 1, wherein the through hole is provided to intersect with the refrigerant flow path or the refrigerant flow-path groove, and
wherein the lower substrate includes a refrigerant-leakage prevention member that prevents the refrigerant from leaking out to the lower surface of the lower substrate through the through hole into which the screw member is inserted.

8. The wafer placement table according to claim 1, wherein the lower substrate is made of an easily machinable material.

* * * * *